US012610497B2

(12) United States Patent
Chen et al.

(10) Patent No.: US 12,610,497 B2
(45) Date of Patent: Apr. 21, 2026

(54) DUCT STRUCTURES FOR COMPUTING DEVICES

(71) Applicant: Hewlett-Packard Development Company, L.P., Spring, TX (US)

(72) Inventors: Fu-Yi Chen, Taipei City (TW); Yu-Shi Wang, Taipei City (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 366 days.

(21) Appl. No.: 18/497,265

(22) Filed: Oct. 30, 2023

(65) Prior Publication Data

US 2025/0142764 A1 May 1, 2025

(51) Int. Cl.
G06F 1/20 (2006.01)
H05K 7/20 (2006.01)

(52) U.S. Cl.
CPC ........... H05K 7/20145 (2013.01); G06F 1/20 (2013.01)

(58) Field of Classification Search
CPC ...... G06F 1/20; G06F 1/181; G06F 2200/201; H05K 7/20145; H05K 7/20154; H05K 7/1427; H05K 5/069; H05K 7/20009; H05K 7/20163; H05K 7/20918; H01L 23/467
See application file for complete search history.

(56) References Cited

U.S. PATENT DOCUMENTS

| | | | | |
|---|---|---|---|---|
| 6,744,630 | B2 * | 6/2004 | Hutchinson | H01L 23/467 |
| | | | | 361/679.48 |
| 11,425,844 | B2 * | 8/2022 | Tsorng | G06F 1/20 |
| 2003/0235033 | A1 * | 12/2003 | Hutchinson | G06F 1/183 |
| | | | | 361/679.48 |
| 2014/0146471 | A1 * | 5/2014 | Liu | H05K 7/20727 |
| | | | | 454/284 |
| 2016/0088774 | A1 * | 3/2016 | Alvarado | G06F 1/20 |
| | | | | 29/890.03 |
| 2023/0077052 | A1 * | 3/2023 | Henderson | G06F 1/189 |
| 2024/0004812 | A1 * | 1/2024 | Fayneh | G11C 7/1057 |

* cited by examiner

*Primary Examiner* — Mandeep S Buttar
(74) *Attorney, Agent, or Firm* — Quarles & Brady LLP

(57) ABSTRACT

The present disclosure provides an air duct structure to receive a processing component. The air duct structure includes an air inlet opening, an air outlet opening, a plurality of side walls, and a support surface. The air inlet opening is in direct fluid communication with an air inlet of the computer chassis. The air outlet opening is in direct fluid communication with an air inlet of a processing component. The plurality of side walls at least partially define a channel extending between the air inlet opening and the air outlet opening. The support surface receives the processing component on the air duct structure relative to the computer chassis. The processing component includes an air exhaust to diffuse air, and the plurality of side walls at least partially fluidly isolate the air inlet opening from an air diffused from the air exhaust.

11 Claims, 7 Drawing Sheets

DUCT STRUCTURES FOR COMPUTING DEVICES

BACKGROUND

Computing devices can include enclosures (e.g., computer chassis) that house electrical components. In operation, electrical components within an enclosure can generate heat, and increases of heat above threshold levels can degrade a performance of electrical components, and damage portions of the computing device. In particular, electrical components within a chassis can include processing components (e.g., central processing units (CPU), graphics processing units (GPUs or graphics cards), computing chips, network devices, storage disks, solid state drives, memory sticks, etc.) that can generate a significant heat within the computer under elevated computing loads. Computing devices can include features for transferring heat away from processing components of the computing devices, which in some cases can include fans for generating an air flow across all or a portion of the enclosure, as well as ventilation to allow air to enter and exit the enclosure (e.g., to allow cool air to be introduced into the enclosure and heated air to be expelled from the enclosure).

BRIEF DESCRIPTION OF THE DRAWINGS

The following drawings are provided to help illustrate various features of examples of the disclosure and are not intended to limit the scope of the disclosure or exclude alternative implementations.

DETAILED DESCRIPTION OF THE PRESENT DISCLOSURE

Figure 1:
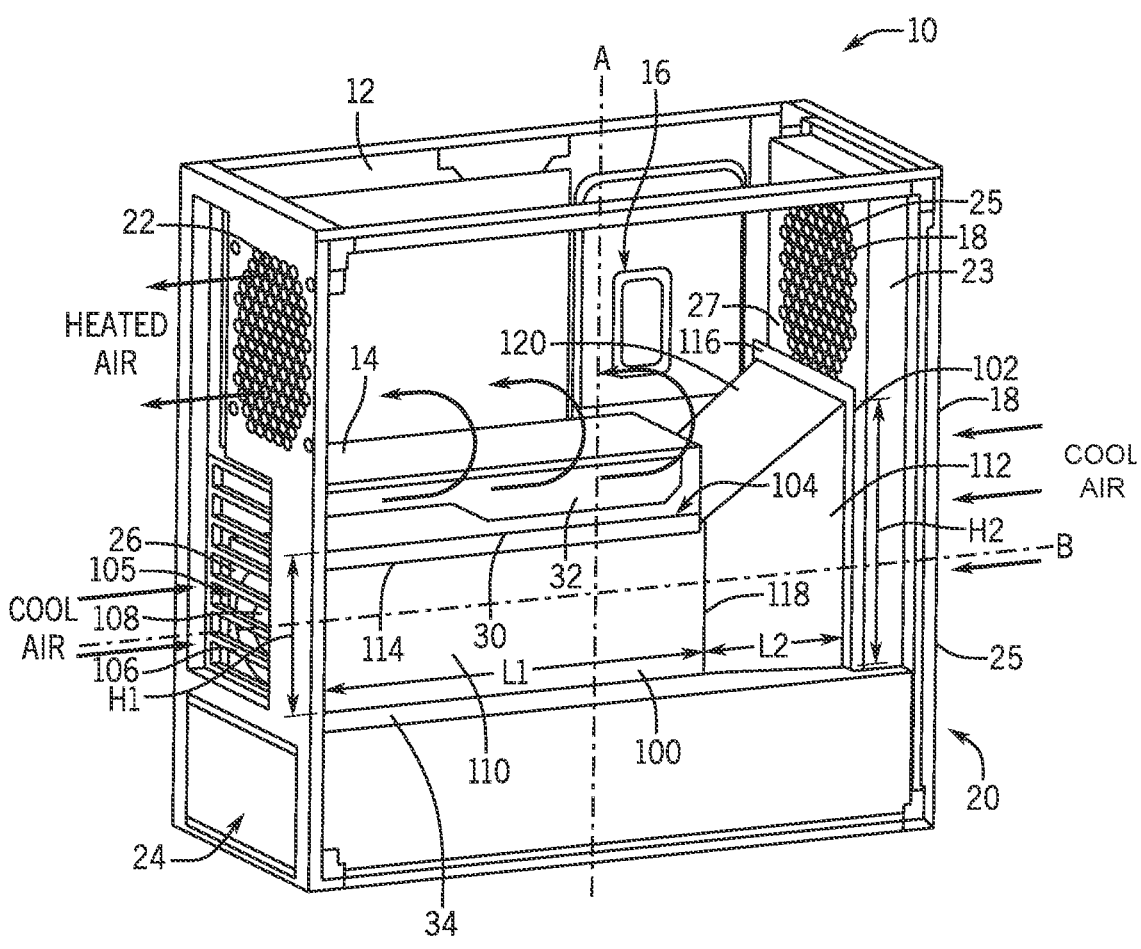
FIG. 1 is an isometric view of a computer chassis with a duct structure installed, showing an airflow through the computer chassis, according to some aspects of the present disclosure.

The disclosed technology is not limited in its application to the details of construction and the arrangement of components set forth in the following description or illustrated in the following drawings. Other examples of the disclosed technology are possible, and examples described and/or illustrated here are capable of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of." For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

Also as used herein, unless otherwise limited or defined, the terms "about," "substantially," and "approximately" refer to a range of values ±5% of the numeric value that the term precedes. As a default the terms "about" and "approximately" are inclusive to the endpoints of the relevant range, but disclosure of ranges exclusive to the endpoints is also intended.

Also as used herein, unless otherwise defined or limited, the term "lateral" refers to a direction that does not extend in parallel with a reference direction. A feature that extends in a lateral direction relative to a reference direction thus extends in a direction, at least a component of which is not parallel to the reference direction. In some cases, a lateral direction can be a radial or other perpendicular direction relative to a reference direction.

The following detailed description is to be read with reference to the figures, in which like elements in different figures have like reference numerals. The figures, which are not necessarily to scale, depict selected examples and are not intended to limit the scope of examples of the disclosure.

Electronic processing components (e.g., GPUs, CPUs, networking components, solid state drives, hard drives, memory sticks, etc.) of a computing device can generate heat during operation, and a computing device can include systems and features for transferring heat away from the electronic components. In some cases, electronic components within a computer chassis can be equipped with cooling systems (e.g., fans, heatsinks, etc.) to transfer heat away from the component(s). As an example, graphics cards (e.g., GPUs) of a computing system can include fans which can draw air from within the computer chassis, blow the air across the graphics card, and exhaust the air into a volume of the enclosure. In some cases, this can produce a recirculation of air through the graphics card, with heated air from the exhaust of the graphics card being blown through the graphics card. There is therefore a need in the field of computing to provide systems and methods for improving an air flow through an enclosure (e.g., through a computer chassis) and reducing an air recirculation through processing components within the enclosure (e.g., a graphics card) to advantageously improve a cooling efficiency of the computing device. In some cases, physical components within a computer chassis can impede an air flow through the chassis and reduce a cooling of a processing component (e.g., a graphics card, a CPU, a network device, a storage device, etc.). As an example, a graphics card may be supported within a computer chassis with a bracket, and a portion of the bracket can be positioned between the graphics card and an air inlet of the chassis, partially impeding an air flow from the inlet to the graphics card. The presence of the bracket can increase a power required to induce an airflow across the graphics card and can generally reduce a cooling efficiency for the graphics card (e.g., compared to configurations of a computer chassis without a bracket in an air flow path between an inlet and the graphics card). A cooling efficiency can have an inverse relationship with power required to cool a component, and therefore, reducing a cooling efficiency can increase a power required to cool a component. For example, a reduction in cooling efficiency caused by any physical impedance (e.g., internal structures of the chassis, solid state drives, power supply units, wiring, circuitry, etc.) along an air flow path between an inlet of a chassis and a processing component to be cooled can increase a power required cool the processing component (e.g., to dissipate heat generated by the processing component). Further, in some cases, a weight of processing components in a computer chassis can produce a deformation of the component, or a change in orientation of the component relative to the computer chassis over time. For example, a processing component (e.g., a graphics card, a CPU, a network card, a solid-state drive, a hard disk, a memory stick, etc.) can be mounted within a computer chassis in a horizontal orientation (e.g., an elongate edge or surface of a graphics card can be substantially parallel to a horizontal direction or plane). In some cases, over time, the processing component can be susceptible to a gravity-induced deflection (e.g., "GPU sag"), whereby, over time, a weight of the processing component produces a downward deflection of portions of the processing component (e.g., edges and surfaces of a graphics card that were installed in a horizontal orientation can deflect to be at an oblique angle relative to a horizontal plane). There is therefore a need in the art to provide support for processing components in a computer chassis to prevent a gravity-induced deflection (e.g., a GPU sag) of the processing component within the computer chassis.

In some examples, the technology disclosed herein provides an air duct structure to receive a processing component. The air duct structure can include an air inlet opening, an air outlet opening, a plurality of side walls, and a support surface. The air inlet opening can be in direct fluid communication with an air inlet of the computer chassis. The air outlet opening can be in direct fluid communication with an air inlet of a processing component. The plurality of side walls can at least partially define a channel extending between the air inlet opening and the air outlet opening. The support surface can receive the processing component on the air duct structure relative to the computer chassis. The processing component can include an air exhaust to diffuse air, and the plurality of side walls can at least partially fluidly isolate the air inlet opening from an air diffused from the air exhaust.

In some examples, the technology disclosed herein provides an air duct structure including a first portion and a second portion. The first portion can include an air inlet opening and a first plurality of walls, the first plurality of walls at least partially defining a first channel having a first cross-sectional area. The second portion can include an air outlet opening, a support surface sized and positioned to receive a processing component, and a second plurality of walls at least partially defining a second channel having a second cross-sectional area. The second cross-sectional area can be smaller than the first cross-sectional area. The second channel can be fluidly continuous with the first channel to form a combined channel between the air inlet opening and the air outlet opening.

In some examples, the technology disclosed herein provides a computer system including a computer chassis, a duct structure, and a processing unit. The computer chassis can include a chassis inlet on a first side of the computer chassis, a chassis outlet opening on a second side of the computer chassis, and an interior surface facing an interior of the chassis. The duct structure can include a support shelf, a plurality of side walls, and a sealing component, the plurality of side walls defining a channel between a duct structure inlet and a duct structure outlet, the duct structure inlet being aligned with the first fan to receive an air flow into the channel, and the sealing component sealing an interface between the duct structure inlet and the interior surface. The processing unit can include an air inlet and an air exhaust, the processing unit being supported on the support shelf, the air inlet receiving an air flow from the duct structure outlet, and the air exhaust being upstream of the chassis outlet opening.

In some examples, the technology disclosed herein provides a method of installing a duct structure in a computer chassis. A first channel structure having a bottom wall, a support surface, a mounting tab, and an upwardly-extending plate member can be inserted into a computer chassis, with the bottom wall supported on a surface of the chassis, and a computing component supported on the support surface. The computing component can include a distal surface that is adjacent to the upwardly-extending plate member when the first channel structure is inserted in the computer chassis. The first channel structure can be fastened to the chassis at the first mounting tab. The computing component can be fastened to the first channel structure at the upwardly-extending plate. A second channel structure can be inserted into the computer chassis, the second channel structure including an inlet opening, a gasket at least partially surrounding the inlet opening, a mounting surface, and an overhang tab. When the second channel structure is inserted into the computer chassis, the gasket can abut a surface of the computer chassis, the mounting surface can abut a lateral surface of the computer chassis, and the overhang tab can extend past an interface between the first structure and the second structure. The second channel structure can be fastened to the chassis at the mounting surface.

Computing devices can include features and systems for facilitating an air flow across heat-generating components to transfer heat out of the computing device. For example, FIG. 1 illustrates a computing device 10, which, as illustrated, includes a chassis 12 and a processing component 14 (e.g., a graphics card) housed within an interior volume 16 of the chassis 12. In the illustrated example, the processing component 14 is a graphics card. In other examples, a processing component can be a CPU, a memory disk, a network card, a solid-state drive, or any other heat-generating components of a computing system. In an operation of the computing device 10, the processing component 14 can generate a heat, which can increase a heat within the interior volume 16. As illustrated, the chassis 12 can include ventilation for facilitating an air flow through the interior volume 16 of the chassis 12 and transfer a heat out of the interior volume 16. For example, as shown, the chassis 12 can have openings 18 in a front portion 20 of the chassis 12, and openings 22 in a rear portion 24 of the chassis 12. In the illustrated example, a fan assembly 23 is provided in the front portion 20, including a plurality of fans 25. As shown, the fan assembly 23 can have an interior planar surface 27 that can extend vertically (e.g., parallel to a vertical axis A) and can at least partially define a front boundary of the interior volume 16. The interior planar surface can extend along a plane that is perpendicular to a horizontal longitudinal axis B (e.g., an axis in a direction parallel to airflow into the chassis at openings 18). In some examples, air can flow into the openings 18 in a direction from the front portion 20 to the rear portion 24 generally parallel to the axis B. The openings 18 can extend through the fan assembly 23 (e.g., the openings 18 can be defined in the interior planar surface 27), and an opening 18 can correspond to a fan 25 (e.g., a fan 25 can be aligned with a corresponding opening 18 to blow air therethrough into the chassis 12). A fan assembly for a chassis can include any number of fans arranged in a vertical column. Further, in some cases, fan assemblies for computing devices can include multiple columns of fans. In general, then, air can flow into the chassis 12 through the openings 18 and can flow out through the openings 22 (e.g., air flow through the interior space 16 can generally flow from the front portion 20 to the rear portion 24). In some cases, a computing device can be configured to receive an inlet air through a bottom portion of a chassis, with air being blown upwardly into an interior space of a chassis alternatively or additionally to air flowing into the chassis at a front portion or a lateral side of a chassis. For example, a computer chassis can include an air inlet at a bottom of the chassis, and an exhaust (e.g., an air outlet) can be at a rear of the chassis. In this configuration, a cooling system for a computer chassis can include a fan bank in a bottom of a chassis to blow air upwardly (e.g., opposite the direction of gravity) into the chassis, and air can exit the chassis through openings in a rear of the chassis (e.g., a rear exhaust).

As further illustrated, the processing component 14 can include features for facilitating airflow through electrical components of the processing component 14 to provide direct heat transfer for the electrical components. The processing component 14 can include air channels, and air can be received into the processing component 14 at an inlet 30 (e.g., defined in a bottom of the processing component 14) and can flow out of the processing component 14 at an exhaust 32. In the illustrated example, the inlet 30 is positioned at a vertical bottom of the processing component 14, with air entering the processing component 14 in an upward direction (e.g., parallel to a vertical axis A). The air can exit the processing component 14 through the exhaust 32 (e.g., through exhaust openings) in a direction that is generally perpendicular to the vertical axis A. In some cases, processing components can define other air flow configurations, including, for example, a configuration with air entering through a bottom of the processing component, and exiting through a top. As shown, exhaust air can flow out of the processing component 14 at the exhaust 32, into the interior volume 16, and the heated air of the interior volume can flow out of the chassis 12 through the openings 22.

As described above, according to some embodiments, duct structures (e.g., structures with sidewalls defining channels for airflow) can be provided to direct an airflow within a computing device. Duct structures can provide structural support for processing components (e.g., the duct structure can at least partially prevent a vertical sag of graphics cards, CPU cards, etc.) and can reduce a recirculation of heated air within the computing device. Additionally, a duct structure can mitigate (e.g., eliminate) impedances along an air flow path between an air inlet of a chassis and a processing component, which can increase a cooling efficiency for the processing component. As an example, a duct structure can eliminate the need for a bracket to support a graphics card in a computer chassis, which can reduce an impedance of air flow from the inlet of the chassis to the graphics card. Additionally, a duct structure can improve a cooling efficiency by increasing a flow of air across (e.g., through) a processing component by specifically directing a portion of air flowing into the computer chassis across the processing component (e.g., as compared to computer chassis not including channels to direct air directly to processing components). In this regard, FIG. 1 illustrates a duct structure 100 installed in the chassis 12. As described further below, an inlet opening 102 of the duct structure 100 can be in direct fluid communication with openings 18 in the front portion 20 of the computer chassis 12 (e.g., the inlet opening 102 can be immediately adjacent to the openings 18, and aligned with the opening 18), and can receive a cool air from an exterior of the chassis 12. The duct structure 100 can further include an air outlet opening 104 in direct communication with the inlet 30 of the processing component 14. In some cases, including as shown, an area of the air inlet opening 102 can be perpendicular to an area of the air outlet opening 104 (e.g., air can flow into the air inlet opening 102 in a direction parallel to axis B, and can flow out of the air outlet opening in a direction parallel to axis A). In other embodiments, an area of an air inlet opening can be parallel with an area of an air outlet opening (e.g., a direction of air flow into the air inlet opening can be parallel to a direction of air flow out of the air outlet opening). In operation, an air can flow from the opening 18 into the inlet opening 102 of the duct structure 100 and can flow from the outlet opening 104 of the duct structure 100 into the inlet 30 of the processing component 14, to cool the processing component 14. An air flowing through the processing component 14 can flow out of the exhaust 32 into the interior space 16 and can flow out of the openings 22 to transfer heat out of the chassis 12. In the illustrated embodiment, an interior channel 105 of the duct structure 100 (e.g., an airflow channel defined between the inlet opening 102 and the outlet opening 104) can be at least partially (e.g., completely) fluidly separated from the interior space 16, and features and structures of the air duct structure 100 can at least partially restrict a recirculation of heated exhaust air from the exhaust 32 into the channel of the duct structure 100.

A duct structure can include elements for increasing an air flow through a processing component (e.g., a graphics card) within a computing device, to increase a heat transfer of heat away from the processing component. In this regard, in the illustrated example, the duct structure 100 includes a secondary inlet opening 106 for receiving an air into the interior channel 105 of the duct structure 100. As shown, the secondary inlet opening 106 is positioned opposite the air inlet opening 102 in an elongate direction (e.g., along axis B) of the air duct structure 100. The secondary inlet opening 106 can increase a total inlet area of air into the air duct structure (e.g., in combination with the air inlet opening) and can thus improve a cooling efficiency for processing components. The secondary opening 106 can be in direct fluid communication with an opening 26 defined in the rear portion 24 of the chassis 12 and can receive a cool air from outside the chassis 12 through the opening 22. In other embodiments, secondary openings of duct structures can be aligned with (e.g., in fluid communication with) openings in a lateral side of a chassis, or a bottom side of a chassis. In some cases, fans of the processing component 14 can suck air through the interior channel 105 of the duct structure 100 and providing the secondary opening 106 can increase a capacity of air flow through the processing component 14, with the air flow generated by the fans of the processing component 14 and the fans 25 of the fan assembly 23. The fans of the processing component 14 can be arranged to create a vacuum within the interior channel 105 of the air duct structure 100 and can operate to induce a flow through the air inlet opening 102 and the secondary opening 106 in a direction towards the outlet opening 104. In the illustrated example, a fan 108 is installed within the duct structure 100 at the secondary opening 106. The fan 108 can operate to increase a rate of air flow through the interior channel 105 of the duct structure 100 and prevent an escape of cool air out of the chassis 12 through the secondary opening 106 (e.g., through the secondary opening 106 and the opening 26). In other embodiments, a duct structure does not include a secondary inlet opening. In some cases, a duct structure including a secondary inlet opening does not include a fan (e.g., the secondary inlet opening of the duct structure can be aligned with a fan of the chassis 12). In the illustrated example, the secondary opening 106 and the opening 26 are positioned vertically below the opening 22 (e.g., an opening through which heated air escapes the chassis). In some cases, a vertical distance between the opening 26 and the opening 22 can be selected to prevent a recirculation of heated air from the opening 22 through the opening 26.

An air duct structure can be sized and configured to accommodate a processing component (e.g., a graphics card) within a computer chassis. In the illustrated example, the duct structure 100 includes a delivery structure 110 and a receiving structure 112. The delivery structure 110 has a height H1 defined between a floor surface 34 of the chassis 12, and a distal edge of a lateral retaining lip 114 of the delivery structure 110. The height H1 can have a fixed vertical relationship (e.g., a vertical offset in a direction parallel to axis A) relative to a mounting surface of the duct structure 100 (e.g., a mounting surface of rubber feet 142 positioned on a shelf 136, shown in FIGS. 2-4 on which a graphics card is supported). In the illustrated embodiment, the height H1 is about 80 mm. In other examples, a height of a delivery structure can be a height that is approximately equal to a mounting height of a processing component in a computer chassis (e.g., a distance between a floor surface of the computer chassis, and a bottom surface of the processing component). For example, a height of a delivery structure can be between about 50 mm and about 110 mm, between about 60 mm and about 100 mm, between about 70 mm and 90 mm, between about 75 mm and about 85 mm. The delivery structure can have a length L1 defined in a direction parallel to the axis B. The length L1 can be a length that is greater than or equal to a length of the processing component 14, to allow the processing component 14 to be fully supported on the delivery structure 110. In some examples, the length L1 can be about 342 mm. In some examples, the length can be any length that corresponds to a length of a processing component to be supported on a delivery structure. In some cases, the length L1 can be a variable length to allow the air duct structure 100 to be usable with processing components having different dimensions (e.g., different lengths along a direction parallel to axis B). For example, a delivery structure can be telescoping in an elongate direction (e.g., a direction parallel to axis B shown in FIG. 1) to receive processing components having different lengths. In some cases, a receiving structure can be telescoping to further accommodate differently sized processing components. As further described below, the delivery structure 110 can be substantially straight, with the height H1 of the delivery structure 110 being constant along the length direction (e.g., parallel to axis B). The delivery structure 110 can be sized and configured to support the processing component 14 so that a horizontal surface of the processing component 14 is substantially parallel with the floor surface 34 (e.g., the processing component 14 sits level on a surface of the delivery structure 110).

In some cases, a cross-sectional area of an air inlet opening of a duct structure can be greater than a cross sectional area along a channel of the duct structure. For example, reducing a cross-sectional area along a flow path of air through a duct structure can increase air flow speed through a channel of the duct structure and increase an inlet capacity of the duct structure. As further shown, the receiving structure 112 can define an inlet height H2 which, as illustrated, is larger than the height H1. The inlet height H2 can be defined between a bottom of the inlet opening 102 and a top of the inlet opening 102. The height H2 can correspond to an airflow capacity into the duct structure 100 (e.g., a larger inlet height H2 can correspond to a greater area of the inlet opening 102 and a greater airflow capacity through the inlet opening 102 into the duct structure 100). In some cases, the inlet height H2 can be sized to correspond to fans 25 of the computing device 10. For example, a fan 25 of the computing device 10 can have a height of 120 mm, measured vertically from the floor surface 34, and the height H2 can be greater than 120 mm, to fully receive an airflow generated by the fan 25 into the duct structure 100. In some cases, an inlet height H2 can correspond to the height of two fans vertically arranged in a fan assembly (e.g., fan assembly 23). For example, the inlet height H2 can be greater than 240 mm (e.g., to fully receive airflow from two vertically arranged fans having individual heights of 120 mm), or greater than 280 mm (e.g., to fully receive airflow from two vertically arranged fans having individual heights of 140 mm). In some cases, an inlet opening can have a height that corresponds to a height of all fans in a fan bank of a chassis, so that substantially all (e.g., all) air flowing through inlet openings in a front portion of the chassis flows into the inlet opening of the duct structure. In some cases, an inlet opening can partially align with a fan in a front portion of a computer chassis, with a portion of the air flow generated by the fan flowing directly into a duct structure, and a portion of the air flow from the fan flowing into an interior volume of the chassis. For example, in some cases, an inlet opening of a chassis can have a height of 180 mm, which can extend to the height of one and a half 120 mm fans (e.g., an airflow from a first fan can be fully received into the duct structure, and a portion of the airflow of a second fan can be received into the duct structure). In some cases, a height of the inlet opening can be adjustable to allow a user to configure the duct structure to achieve desired air flow parameters.

A receiving structure of a duct structure can have a length to accommodate the dimensions of a chassis and a processing component in the chassis. For example, as described above, the length L1 of the delivery structure 110 can correspond to a length of the processing component 14. In some cases, including as illustrated, the receiving structure 112 can have a length L2 in a direction parallel to the axis B. The length L2 can be any length to span a distance between the interior planar surface 27 and the delivery structure 110. When the receiving structure 112 is installed in the chassis 12, proximate to the delivery structure 110, a volume (e.g., the receiving channel 128 shown in FIGS. 2, 3, and 6) defined by the receiving structure 112 can be continuous with a volume (e.g., a delivery channel 138, shown in FIGS. 2, 3, 4, and 6) defined by the delivery structure 110 to define the continuous interior channel 105 between the air inlet opening 102 and the air outlet opening 104. In some cases, a height of a distal end 118 of the receiving structure 112 opposite the inlet opening 102 in a direction parallel to the axis B (e.g., proximate the delivery structure 110) can be smaller than the height H2 of the inlet opening 102. The height of the distal end 118 can be a height that facilitates an airflow from the receiving structure 112 to the delivery structure 110 (e.g., with minimal or no air loss at the interface between the distal end 118 and the delivery structure 110). For example, the height of the distal end 118 of the receiving structure 112 can be substantially identical to a height of a shelf of the delivery structure 110 (e.g., shelf 136 shown in FIGS. 2-4 and 6) that defines a top of the channel through the delivery structure 112 (e.g., delivery channel 128 shown in FIG. 2).

Figure 2:
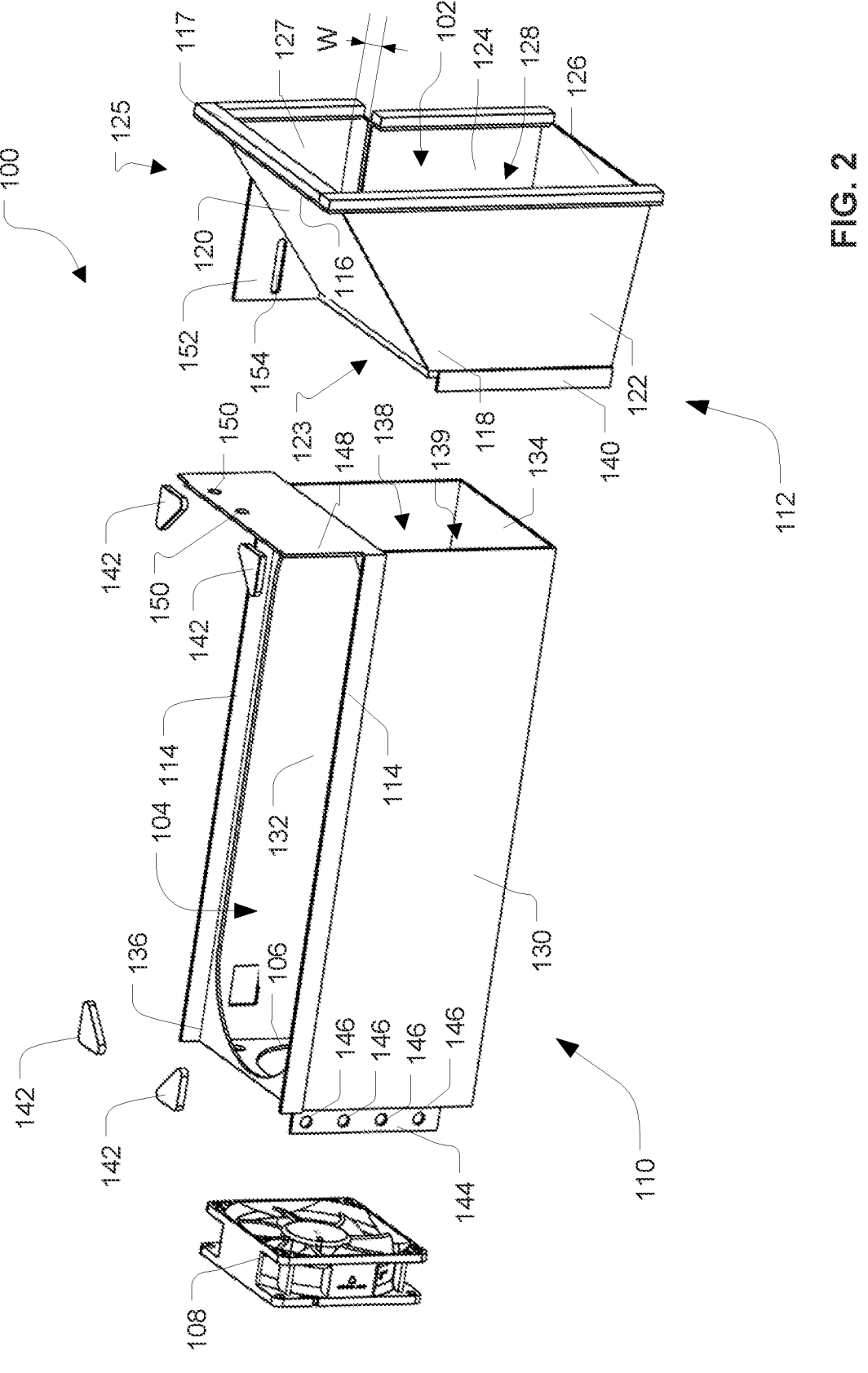
FIG. 2 is an exploded view of a duct structure according to aspects of the present disclosure.

As noted above, a duct structure can comprise multiple channel structures (e.g., individual components each having a plurality of walls defining a corresponding channel). For example, in the illustrated embodiment, the receiving structure 112 and the delivery structure 110 are separate channel structures (e.g., the receiving structure 112 and the delivery structure 110 are not integral with respect to each other) that are combined (e.g., assembled) to form the duct structure 100. FIG. 2 illustrates the duct structure 100 in an exploded view, showing the individual components of the duct structure 100. In some examples, a duct structure can be a unitary structure (e.g., the structure can comprise a single integral piece). For example, when an air inlet is defined in a bottom of a computer chassis, with fans blowing air upwardly (e.g., opposite a direction of gravity) into the chassis to cool a processing component, a duct structure can include only one structure to fluidly connect the inlet of the chassis with an inlet of the processing component (e.g., the duct structure can define a channel from fans at the inlet of the chassis to the inlet of the processing component). When an air duct structure is provided for a chassis including an air inlet in a bottom portion of the chassis, an air inlet opening can be defined on a bottom side of the air duct structure and the air outlet opening can defined on a top side of the air duct structure, the top side positioned opposite the bottom side along a vertical axis (e.g., an axis parallel to a direction of gravity). While, in the illustrated embodiments, the receiving structure 112 and the delivery structure 110 are separate components, in other examples, a duct structure can define a similar geometry as the duct structure 100 but can be of unitary construction.

As shown in FIG. 2, the receiving structure 112 can include a first lateral sidewall 122, a top wall 120, a second lateral sidewall 124, and a bottom wall 126. Each of the walls 120, 122, 124, and 126 can extend between the inlet opening 102 and an interface opening 123 of the receiving structure 112, the interface opening 123 being on an opposing side of the receiving structure 112 from the inlet opening 102 in the direction B. The lateral sidewalls 122, 124 can extend upwardly from opposing lateral sides of the bottom wall 126 (e.g., in a direction parallel to direction A), and can be substantially planar. Collectively, the lateral sidewalls 122, 124, the bottom wall 126, and the top wall 120 can at least partially define a receiving channel 128 extending between the inlet opening 102 and the interface opening 123 of the receiving structure 112. In some cases, a receiving structure can include less than four walls. For example, a receiving structure can include side walls and a top wall, and a bottom of a receiving channel can be defined by a surface (e.g., the floor surface 34 of the chassis 12 shown in FIG. 1) of a chassis. In some cases, a lateral boundary of a receiving channel can be defined by a surface of a chassis.

Figure 7:
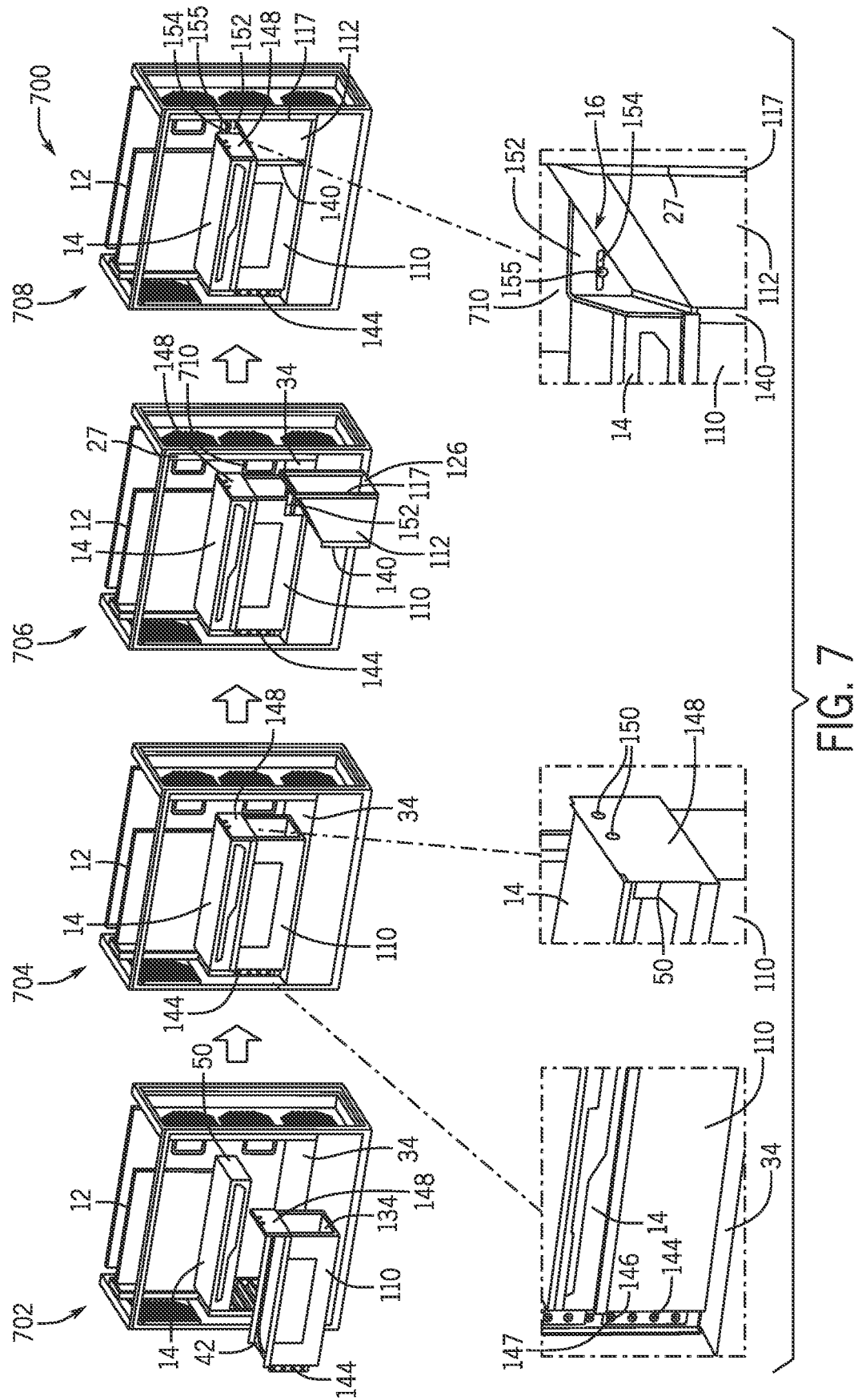
FIG. 7 is a schematic view of an installation process for a duct structure within a computer chassis, according to some aspects of the present disclosure.

In some cases, a receiving structure can include structures and features to facilitate positioning of the receiving structure within a computer chassis. For example, a surface of a receiving structure can be sized and positioned to abut a surface of the computer chassis when the receiving structure is installed into the computer chassis, and when the surface of the receiving structure abuts the surface of the computer chassis, an inlet opening of the receiving structure can be positioned (e.g., laterally positioned) to align with a fan. In this regard, FIG. 2 further illustrates a mounting portion 125 of the receiving structure 112. The mounting portion 125 can extend outwardly from the receiving structure in a lateral direction, away from the receiving channel 128. In some cases, as shown, the mounting portion 125 includes a planar wall 127 that can function as a datum plane defining an interface between the receiving structure 112 and a computer chassis (e.g., as shown in FIG. 7). The planar wall 127 can be parallel to the lateral sidewall 124, and can be offset from the lateral sidewall 124 in a lateral direction by a distance W. When the receiving structure 112 is installed in a computer chassis, with the planar wall 127 abutting a surface of the computer chassis, the interface opening 123 can be aligned with an interface opening 139 of the delivery structure 110. In some cases, the planar wall 127 partially defines the receiving channel (e.g., the planar wall 127 bounds the receiving channel laterally as shown). In some cases, a receiving structure does not include a mounting portion, and a lateral sidewall can abut a surface of a chassis when the receiving structure is installed in the computer chassis. In some cases, other locating features can be provided for a receiving structure (e.g., corresponding apertures and protrusions of the chassis and the receiving structure, alignment of apertures for fasteners to extend through, abutment against stopping members of a chassis, etc.).

Figure 6:
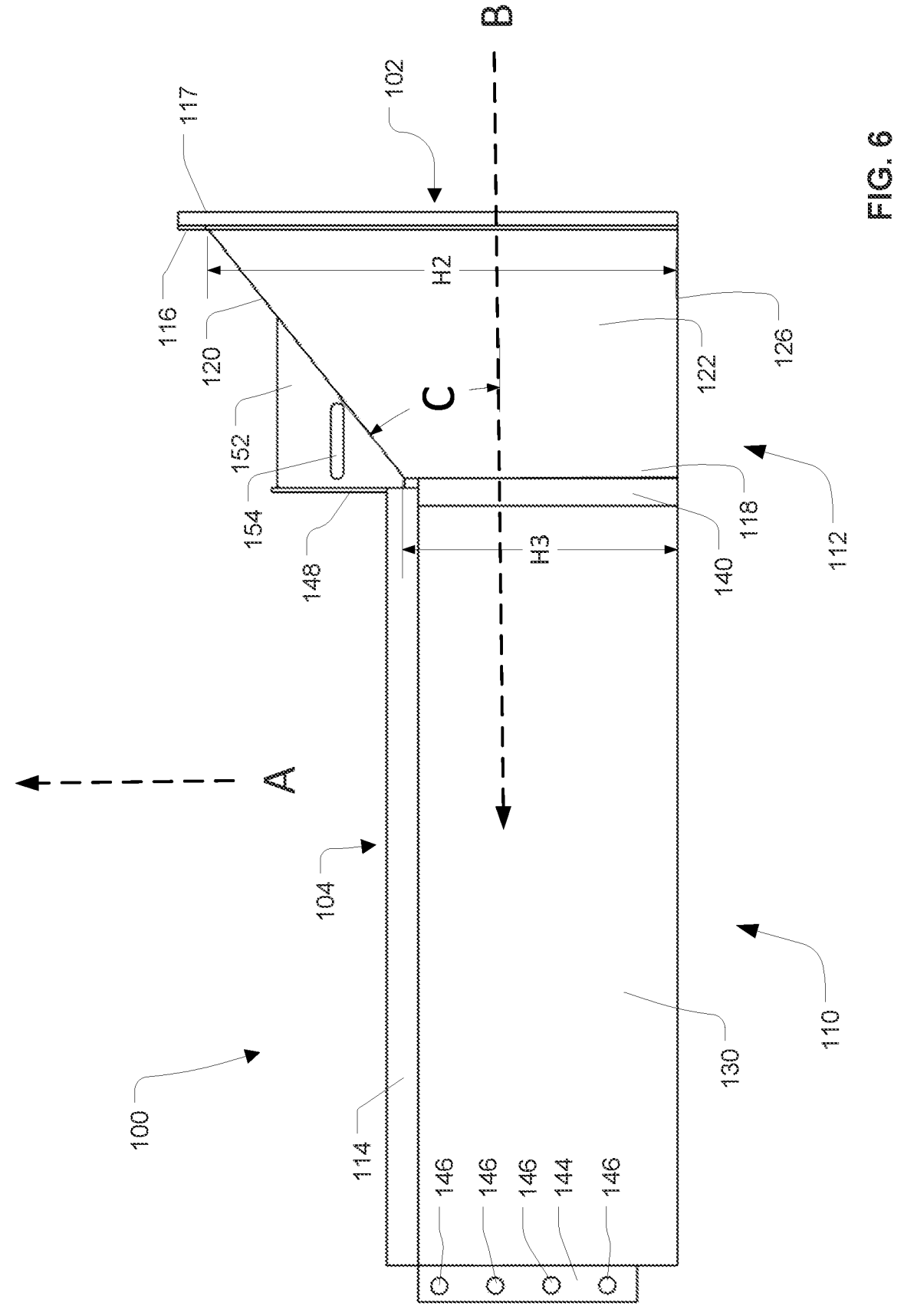
FIG. 6 is a left side elevation view of the duct structure of FIG. 2.

A top wall of a receiving structure can be oriented to accommodate a difference in height between an interface opening of the receiving structure and an height of the inlet opening of the receiving structure (e.g., height H2 shown in FIG. 1). For example, as shown in FIG. 6, a first side of the top wall (e.g., proximate the inlet opening 102) can be positioned at height H2, relative to a bottom surface of the bottom wall 126. A second side of the top wall 120 (e.g., proximate the delivery structure 110) can be positioned at a lower height H3 from the bottom surface of the bottom wall 126. The height H3 can define the minimum height of the receiving channel 128 and the height H2 can define the maximum height of the receiving channel 128, with height H2 being higher than height H3. As illustrated, the top wall 120 can be positioned at an oblique angle C relative to a horizontal axis parallel to direction B. In some cases, a top wall can be shaped to facilitate an airflow along the receiving channel and can include curved portions in addition to or alternatively to a straight angled portion. In some cases, an inlet height can be equal to a height at a side of the delivery structure proximate to the delivery structure, and a top wall can be substantially horizontal.

In some cases, as shown, an air duct structure can include features for sealing an interface of an air inlet of the air duct structure and an air inlet of a computer chassis. It may be advantageous to fluidly isolate the inlet of the air duct structure from an interior space of a computer chassis, to prevent recirculation of heated air into the inlet of the air duct structure (e.g., and consequently, through the processing component). For example, as shown in FIGS. 2-6, the air duct structure 100 can include a flange 116 along a perimeter of the air inlet opening 102, extending outwardly from the air inlet opening 102 (e.g., in a direction away from the channel 128). The flange 116 can be planar, and can be perpendicular to the axis B. When the air duct structure is installed in a computer chassis, the flange 116 can be parallel to an interior surface of the computer chassis (e.g., as shown in FIG. 1, with the flange 116 parallel to the interior surface 27). In some cases, a flange of an air duct structure can abut a surface of a chassis, to seal an interface between the air inlet opening of the air duct structure and an air inlet of the computer chassis. In some cases, a flange of an air duct structure can include mounting apertures, and fasteners can extend through the apertures to secure the air duct structure to the chassis. As shown, the flange 116 extends outwardly from the lateral sidewalls 122, 124, 127 and the top wall 120. In other examples, a flange can fully extend around a perimeter of an inlet opening of an air duct structure. In some cases, additional features can be provided to seal an interface between an air duct structure and an inlet of a computer chassis. For example, in the illustrated embodiment, the receiving structure includes gasket members 117 along the flange 116. The gasket members 117 can contact a surface of a computer chassis (e.g., interior surface 27 shown in FIG. 1) when the duct structure 100 is installed in the chassis. In some cases, the gasket members 117 can be rubber. In other examples, the gasket members can be any material suitable to form a seal between the flange 116 and a surface of a chassis. In some cases, an air duct structure does not include gasket members. In some cases, a secondary inlet (e.g., secondary inlet 106) can include similar features for sealing the secondary inlet relative to the chassis (e.g., the secondary inlet 106 can include one or both of a flange and gasket members).

Figure 3:
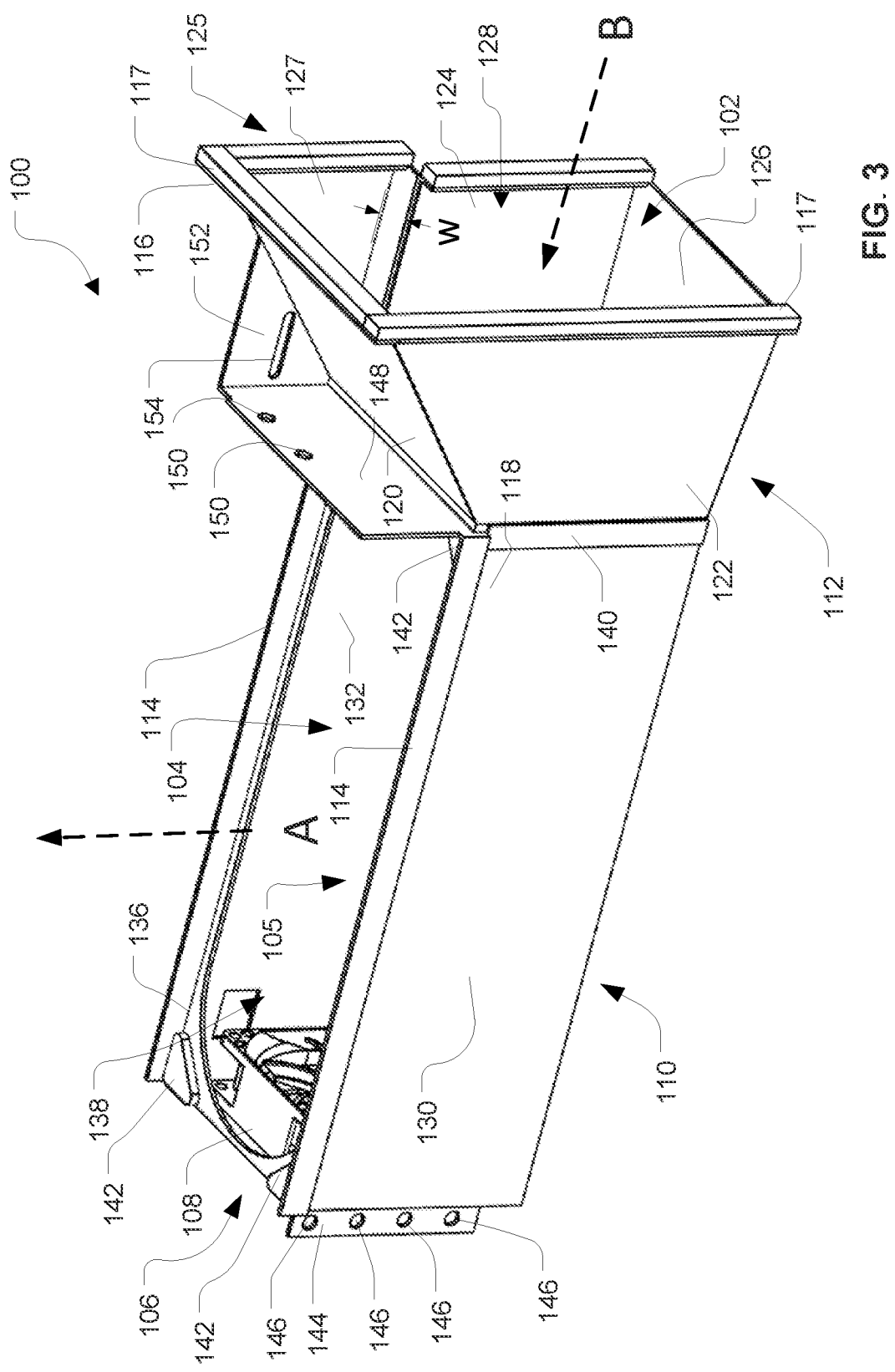
FIG. 3 is a top front left isometric view of the duct structure of FIG. 2.
Figure 4:
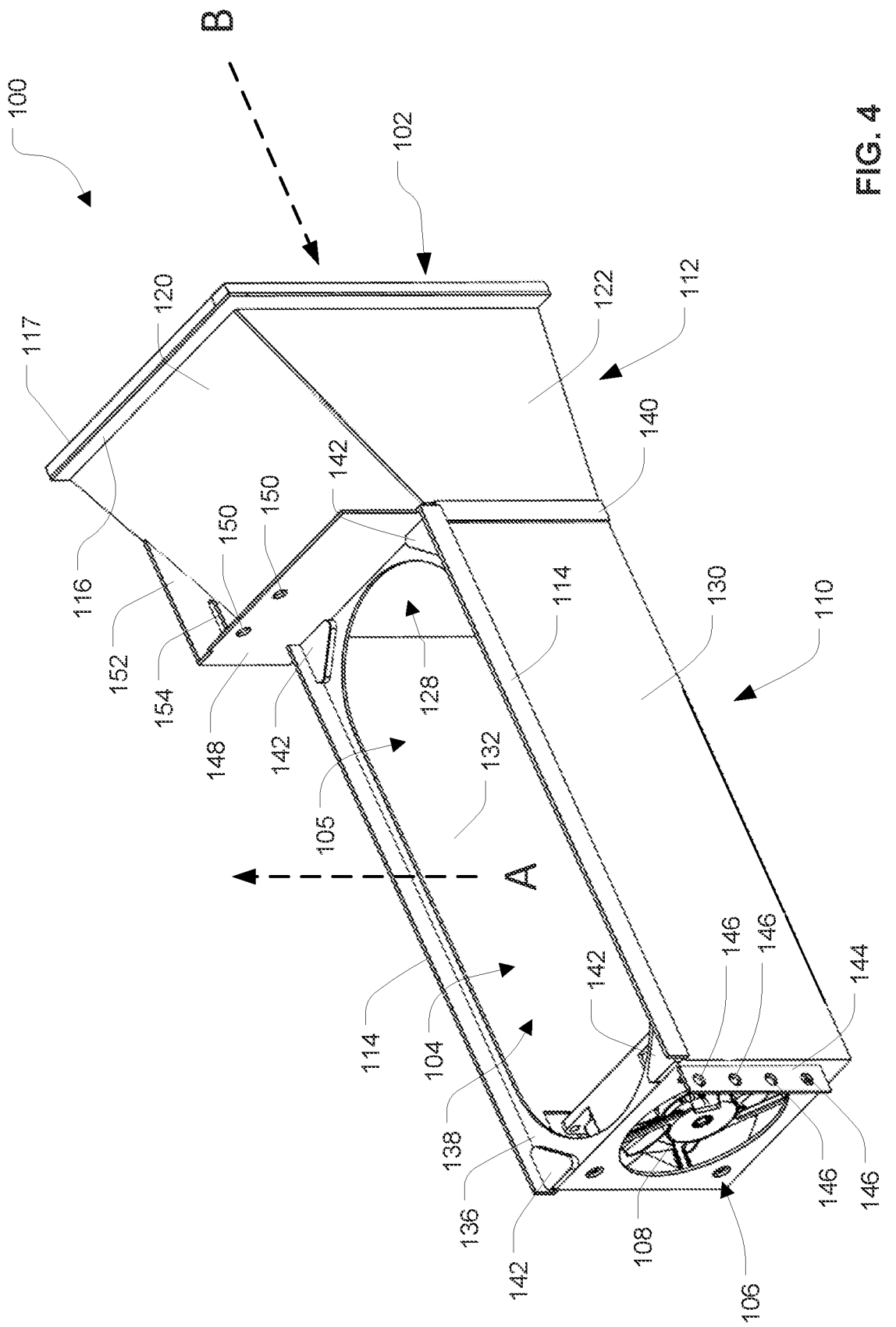
FIG. 4 is a top rear left view of the duct structure of FIG. 2.
Figure 5:
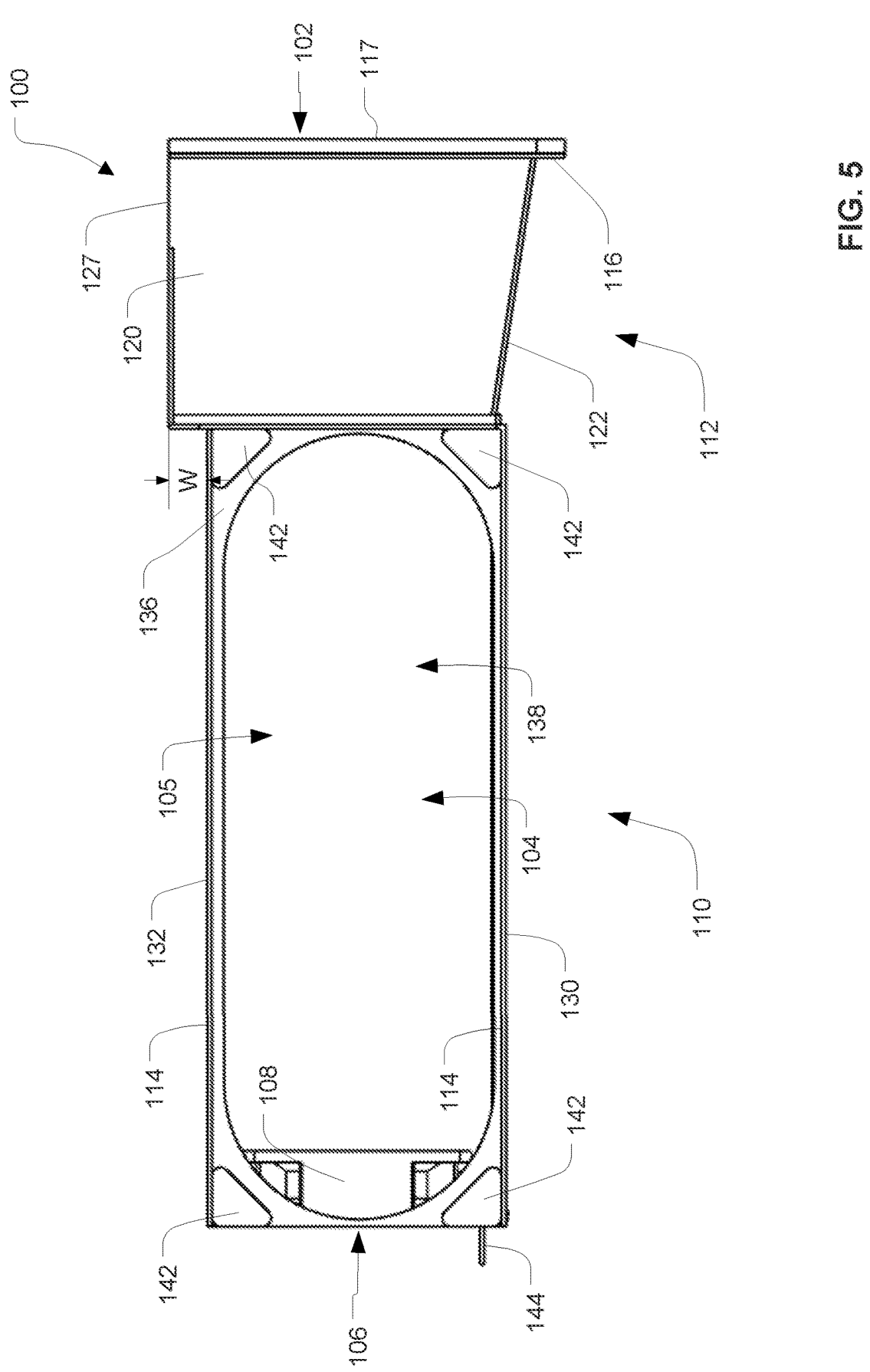
FIG. 5 is a top plan view of the duct structure of FIG. 2.

Referring back to FIG. 2, as further shown, the delivery structure 110 can include a first lateral sidewall 130, a bottom wall 134, a second lateral side wall 132, and a horizontal shelf 136. The lateral sidewalls 130, 132 can be substantially parallel and can extend upwardly from the bottom wall 134 at opposing lateral sides of the bottom wall 134. The shelf 136 can define a planar surface that is substantially parallel with the bottom wall 134 (e.g., a horizontal surface) and can extend between the opposing side walls 130, 132. As further illustrated, the outlet opening 104 can be an opening defined in the shelf 136. Collectively, the lateral sidewalls 130, 132, the bottom wall 134, and the shelf 136 can at least partially define a delivery channel 138 between an interface opening 139 of the delivery structure and the outlet opening 104. In some cases, a delivery structure can include fewer surfaces for defining boundaries of a delivery channel. For example, a delivery structure can include side walls and a shelf, and a bottom of a delivery channel can be defined by a surface (e.g., the floor surface 34 of the chassis 12 shown in FIG. 1) of a chassis. In some cases, a lateral boundary of a delivery channel can be defined by a surface of a chassis. When the delivery structure 110 and the receiving structure 112 are assembled to form the duct structure 100, the interface opening 139 of the delivery structure and the interface opening 123 of the receiving structure can be immediately adjacent to each other, and the receiving channel 128 can be continuous with the delivery channel 138. For example, as shown in FIGS. 3 and 4, the receiving channel 128 and the delivery channel 138 can collectively define the interior channel 105 of the duct structure 100. In some cases, walls of a receiving structure can be substantially flush with walls of a delivery structure when the receiving structure and the delivery structure are assembled, as can advantageously limit an impedance in air flow through the interior channel 105 (e.g., from the inlet opening 102 to the outlet opening 104).

At least one of the delivery structure 112 and the receiving structure 110 can include additional features for partially or fully sealing an interface between the receiving structure and the delivery structure against air leakage. For example, in the illustrated embodiment, the receiving structure 112 includes an overhang tab 140, that extends outwardly from the receiving structure 112 along a lateral side of the receiving structure 112. The overhang tab 140 can be planar and can be substantially parallel with the lateral sidewall 122. When the receiving structure 112 and the delivery structure 110 are assembled to form the duct structure 100, the overhang tab 140 can extend past a portion of the lateral sidewall 130 (e.g., in a direction parallel to direction B) to prevent an air escaping laterally at the interface between the delivery structure 110 and the receiving structure 112 (e.g., as shown in FIGS. 3, 4, and 6). In some cases, an overhang tab of a delivery structure can function to retain the delivery structure in place when the receiving structure and delivery structure are installed in a chassis (e.g., to prevent a lateral displacement of the delivery structure). In other examples, overhang tabs can extend over other sides of an interface between a delivery structure and a receiving structure. In some cases, gaskets can be provided between a delivery structure and a receiving structure to at least partially seal the interface against leakage of air through the interface. In some examples, an overhang tab can extend from a delivery structure to overhang an interface between the delivery structure and the receiving structure.

Further, duct structures can include features for preventing or reducing a displacement of processing components relative to a computer chassis when a processing component (e.g., a graphics card) is supported on the duct structure within the computer chassis. For example, as further shown in FIGS. 2-4, the retaining lips 114 of the delivery structure 110 can extend upwardly from the delivery structure (e.g., in a direction parallel to axis A) on opposing lateral sides of the delivery structure 110. A minimum distance between the opposing retaining lips 114 (e.g., between inwardly-facing surfaces of the respective retaining lips 114) can be greater than a lateral width of a processing component to be supported on the delivery structure 110 (e.g., processing component 14 shown in FIG. 1). When a processing component is supported on the receiving structure 110, the retaining lips 114 can extend upwardly beyond a bottom edge or surface of the processing component, and the retaining lips 114 can constrain a movement of the processing component in a lateral direction (e.g., a contact between the edge or surface of the processing component and the retaining lip can stop further displacement of the processing component in a direction toward the retaining lip). The retaining lip 114 can extend over an interface between a processing component (e.g., processing component 14 shown in FIG. 1) and the delivery structure 110 and can provide a barrier to prevent air leakage at the interface between the processing component and the delivery structure, which can increase a cooling efficiency for the processing component. In some cases, seals (e.g., rubber seals) can be provided between a retaining lip and a processing component to further seal again air leakage between the delivery structure and the processing component. In some cases, a delivery structure of a duct structure includes one retaining lip. In some cases, a lateral movement of a processing component can be constrained on one or both lateral sides of a chassis by side walls of the chassis. In some cases, a delivery structure does not include retaining lips. In some cases, a width of a delivery structure (e.g., a dimension of the delivery structure 110 perpendicular to both of axes A and B) can be adjustable to accommodate processing components having different widths. For example, retaining lips of a delivery structure can be adjusted outwardly (e.g., laterally) to receive processing components having a width that is wider that a width of the delivery structure. In some cases, a delivery structure can telescopically expand and collapse in a width direction to accommodate differently sized processing components.

In some cases, duct structures can include adjustable shutters to seal unused portions of an air inlet or an air outlet against a leakage of air. In some case, a shutter (not shown) can be provided for the air outlet opening 104 to block a portion of the opening. For example, a length of a processing component can be shorter than a length of the air outlet opening, and a shutter can be provided to seal an excess portion of the air outlet opening 104 to prevent air leakage through the portion of the air outlet opening that is not aligned with an inlet of the processing component. In some cases, a shutter can be provided for the secondary inlet opening 106. When the fan 108 is not installed in air duct structure 100, the shutter (not shown) for the secondary outlet can seal (e.g., partially seal) the secondary inlet to prevent an escape of air therethrough. In some cases, a shutter for a secondary inlet opening can be configured to seal the secondary inlet opening when a fan of the secondary inlet opening is not in operation. Shutters for an air duct structure can be manually configured (e.g., an operator can move the shutter between an open, a partially open, and a closed position), or can be automatically positioned (e.g., spring-loaded).

A duct structure can also include features for reducing (e.g., preventing) a displacement of a processing component (e.g., a graphics card, a CPU card, or other heat-generative computing components) relative to the duct structure in a vertical direction (e.g., a direction parallel to direction A) or a longitudinal horizontal direction (e.g., a direction parallel to direction B). For example, with reference to FIGS. 2-4, a plate member 148 can extend upwardly (e.g., in a direction parallel to direction A) from the delivery structure 110 at an side of the delivery structure 110 that is proximate to the receiving structure 112 when the duct structure 100 is assembled (e.g., a side of the delivery structure 110 positioned furthest from the back portion 24 in a direction parallel to direction B when the delivery structure is installed in the chassis 12, as shown in FIG. 1). The plate member 148 can function as a stop, limiting a displacement of a processing component (e.g., processing component 14 illustrated in FIG. 1) in a direction parallel to the axis B when the processing component is supported on the delivery structure 110. In some cases, as shown, the upwardly-extending plate member 148 can include apertures 150, which can align with corresponding apertures of a processing component when the processing component is supported on the delivery structure 110. A processing component can be secured to the delivery structure 110 with fasteners (e.g., screws, nails, etc.) inserted through the circular apertures 150 to fix a position of the processing component relative to the delivery structure 110. In some cases, a delivery structure can include additional plate members to secure a processing component to the delivery structure at other points. For example, a plate member can extend upwardly from a side of the delivery structure proximate to a rear side of a computer chassis alternatively or in addition to a plate member on a side of the delivery structure closest a front portion of a computer chassis when the delivery structure is installed in the computer chassis.

As noted above, duct structures (e.g., duct structure 100 shown in FIGS. 1-6) can improve a thermal performance of processing components by preventing a recirculation of air and providing a support for the processing components that does not impede an air flow to a processing component. For example, with reference to FIGS. 2-6, the delivery structure 110 can include a mounting tab 144 extending away from a rear of the delivery structure 110 in a direction parallel to the direction B. As discussed further with respect to FIG. 7, when the delivery structure 110 is installed in a chassis, the mounting tab 144 can contact a surface of the chassis in which the duct structure 100 is installed. In the illustrated embodiment, the mounting tab 144 includes a plurality of circular apertures 146. The example shown includes four circular apertures 146, but in other examples, a mounting tab 144 for a delivery structure can include one circular aperture, two circular apertures, three circular apertures, five circular apertures, or more than five circular apertures. In some examples, a mounting tab can include a vertical slot, sized to receive a fastener (e.g., screws). When the delivery structure 110 is installed in a chassis (e.g., chassis 12 shown in FIG. 7), fasteners can secure the delivery structure 110 to the chassis at the circular apertures 146, to fix a position of the deliver structure 110 relative to the chassis.

As shown in FIGS. 2-4, and 6, the receiving structure 112 can include a mounting plate 152 for mounting the receiving structure 112 within a chassis (e.g., as shown in FIGS. 1 and 7). The mounting plate 152 can be substantially (e.g., fully) planar, and can abut a surface or feature of a chassis when the receiving structure 112 is installed in the chassis. The mounting plate 152 can serve as a locating feature for the receiving structure 112 and the duct structure 100 as it can at least partially define a spatial relationship and orientation of the receiving structure 112 relative to the chassis through engagement with a corresponding surface of the chassis. In the illustrated example, the mounting plate 152 is continuous (e.g., integral) and coplanar with the planar wall 127. The mounting plate 152 can include a mounting slot 154, sized and positioned to receive a fastener therethrough to secure the receiving structure 112 relative to a chassis. In some cases, a mounting plate for a receiving structure 112 can include a circular aperture or a plurality of circular apertures for receiving fasteners.

In operation, a processing component (or other computing components) can be subject to vibration, or other forces which can produce movement of the processing component relative to a chassis or other elements within a chassis. For example, fans of a processing component and of a computer chassis can produce displacements of the processing component relative to a support structure. In some cases, a movement of a processing component relative to support elements or other components within a computer chassis can cause damage at an interface between the processing component and other component (e.g., portions of a processing component can be scratched or dented due to an engagement between a hard surface of a bracket or portion of a chassis, and a surface of the processing component). In some cases, engagement of surfaces of components within a chassis (e.g., due to a vibration) can produce unwanted noise in operation of a computing device. As further illustrated in FIG. 2-5, in some cases, feet members 142 can be provided at corners of the shelf 136. The feet members can 142 can be rubber, and corners of a processing component (e.g., processing component 14 shown in FIG. 1) can be supported on the feet members 142 when the duct structure 100 is installed in the chassis. The feet members 142 can reduce a surface area of a processing component in contact with a surface of the duct structure. Additionally, a coefficient of friction between a surface of the feet members 142 and a surface of the processing component can be greater than a coefficient of friction between a surface of the delivery structure 110 (e.g., shelf 136), and feet members 142 can thus increase a friction force between the delivery structure 110 and a processing component, opposing a displacement of the processing component relative to the delivery structure 110. Rubber feet members 142 can further dampen a vibration of the processing component within the chassis. In other examples, feet members can be formed from other materials, including for example, a plastic, a cardboard, a foam, a nitrile, a silicone, a vinyl, a neoprene, or other materials with a property similar to rubber (e.g., a material that provides a degree of elastic deformation relative to relatively harder surfaces of a duct structure and a graphics card). In some cases, additional spacing members can be provided along the shelf between the corners. In some cases, a duct structure does not include feet members.

FIG. 7 is a schematic illustrating a process 700 for installing the duct structure 100 within the computer chassis 12. At block 702, the delivery structure 110 can be inserted into the computer chassis 12. As illustrated, the delivery structure can be inserted in a lateral direction (e.g., perpendicular to both of axes A and B shown in FIG. 1), and features of the delivery structure can be aligned with features of the chassis 12 or processing components (e.g., processing component 14) within the chassis 12. For example, during installation, the delivery structure 110 can be positioned so that a surface of the plate member 148 aligns with a distal surface 50 of the processing component 14. Further, the bottom wall 134 can be supported on the floor surface 34 of the chassis 12. When the delivery structure 110 is inserted into the chassis at block 702, the processing component 14 can rest on the delivery structure 110, with corners of the processing component 14 supported on feet members (e.g., feet members 142 shown in FIG. 2) of the delivery structure 110. In some examples, a delivery structure can be installed in a chassis prior to an installation of a processing component, and a processing component can be installed on the delivery structure.

At block 704, the delivery structure 110 can be secured within the chassis 12. For example, as shown, the mounting tab 144 can contact a surface of the chassis 12, and fasteners 147 (e.g., screws) can be inserted through the circular apertures 146 to secure the delivery structure 110 to the chassis 12 at the mounting tab 144. Securing the delivery structure 110 can further include securing the processing component 14 relative to the delivery structure 110. As further shown at block 704, the plate member 148 can be align with the distal surface 50 of the processing component 14, and fasteners can be inserted through the circular apertures 150 in the plate member 148 and through the distal surface 50 to secure the processing component 14 relative to the delivery structure 110.

At block 706, the delivery structure 112 can be inserted into the chassis 12. Inserting the receiving structure 112 can include aligning a front surface of the gaskets 117 with the interior surface 27 (e.g., described in FIG. 1) and aligning a surface of the bottom wall 126 with the floor surface 34. When the receiving structure 112 is inserted into the chassis 12, the mounting plate 152 can abut a lateral surface 710 of the chassis 12 to at least partially define a position of the receiving structure 112 within the chassis 12.

At block 708, the receiving structure 112 can be secured to the chassis 12. As shown in block 708, the receiving structure can be positioned with the gaskets 117 directly abutting the interior surface 27, at least partially forming a seal between the interior surface 27 and the receiving structure (e.g., partially or fully isolating the inlet opening 102 from the interior volume 16 illustrated in FIG. 1). Further, the overhang tab 140 can overhang a portion of the delivery structure 110 to further isolate an interior of the duct structure (e.g., channel 105 shown in FIG. 2) from the interior space 16 of the chassis 12. At block 708, securing the delivery structure can include inserting a fastener 155 (e.g., a screw) through the slot 154 and into a corresponding portion (e.g., a threaded aperture) defined in the lateral surface 710. In other embodiments, a duct structure can be differently installed. For example, a duct structure can be integral with a chassis (e.g., can be continuous with features of a chassis. In some cases, a duct structure comprises a single unitary construction, and installing the duct structure includes positioning a single component within the chassis and securing the component to the chassis.

The use of duct structures within a computer chassis can improve a heat transfer rate away from a graphics card, can reduce a temperature of the graphics card, and can further improve performance of computing elements, including graphics cards. Benchmarking was performed to assess the thermal and performance aspects of a graphics card within a chassis with a duct structure (e.g., similar or identical to the duct structure 100 described above), and without. The benchmarking was performed by running a standard computing load against the graphics card to generate thermal conditions, using the 3Dmark benchmarking software. An ambient temperature of the environment while testing was maintained at 25 C. When a chassis did not include a duct structure (e.g., a duct structure to prevent recirculation of exhaust air from the graphics card within the chassis), a temperature of the graphics card was 83 C, a temperature of air at a fan intake of the graphic card (e.g., at inlet 30 shown in FIG. 1) was 35 C, and a GPU Clock speed (CLK) was 1675 MHz When the same testing was performed using a duct structure (e.g., duct structure 100 described in FIGS. 1-7), the temperature of the graphics card was 81 C, the temperature at the fan intake of the graphics card was 30 C and the GPU CLK was 1743. In benchmarking, then, the use of a duct structure reduced a temperature of the GPU and a fan intake of the GPU, and increase GPU CLK (e.g., increased a performance of the graphics card) by 4%.

In some cases, a height of a delivery structure (e.g., a distance between a mounting surface of rubber feet 142 positioned on a shelf 136, shown in FIGS. 2-4 and the floor surface 34 of the chassis 12) can correlate to a cooling efficiency for a processing component. An increase in height of the delivery structure (e.g., and therefore a height of a processing component supported on the delivery structure) can produce an increase in cooling efficiency for the processing component. For example, testing was performed to determine thermal performance of duct structures having differing heights for a mounting surface of a delivery structure relative to a floor surface of a chassis (e.g., the height between the floor surface 34 and the mounting surface of rubber feet 142, or a "clearance"). The testing was performed at using the 3DMARK benchmarking software while an ambient temperature of the environment was maintained at 25 C. Further, the processing component that used for testing was a NVIDIA® Geforce RTX™ 4080 graphics card. A height of the delivery structure (e.g., a height of mounting surface) was varied and testing was performed to determine a temperature of the processing component given the height. The results of this testing are shown in the table below "Test Results For Height Variance of GPU", the results demonstrating a reduction of temperature of the processing component (i.e., an increased cooling efficiency) when a height of the receiving structure is increased.

| Test Results For Height Variance of GPU | |
| --- | --- |
| Height (mm) | GPU Temp (Celsius) |
| 23 | 74.1 |
| 42 | 72.4 |
| 53 | 71.1 |
| 63 | 70 |
| 68.9 | 73 |
| 68.4 | 83. |

Some embodiments of the disclosure include a computer system including a computer chassis, a duct structure, and a processing component. The duct structure can be installed within the computer chassis (e.g., the duct structure 100 shown in FIGS. 1-6 can be installed within the computer chassis 12). In some examples, a chassis can be manufactured with duct structures integrated within the chassis to advantageously channel airflow through the chassis. The computer chassis can include a computer chassis including a chassis inlet on a first side of the computer chassis, and a chassis outlet opening on a second side of the computer chassis, and an interior surface facing an interior of the chassis. In some cases, the computer system can also include a fan, positioned to induce an air flow through the chassis inlet. The fan can be installed within a fan bank along the first side of the computer chassis, and the fan bank can include multiple fans. In some cases, the chassis inlet defines an area that is parallel with an area of the chassis outlet (e.g., the inlet can be positioned on a front side of the chassis, and the outlet can be positioned on a back side of the chassis, opposite the front side). In some cases, the first side and the second side can be substantially perpendicular (e.g., the chassis inlet can be positioned at a bottom side of the chassis, and the chassis outlet can be positioned at a back side of the chassis). The duct structure can include a support shelf and a plurality of side walls, and a sealing component, the plurality of side walls defining a channel between a duct structure inlet and a duct structure outlet. The duct structure inlet can be aligned with the chassis inlet to receive an air flow into the channel, and the sealing component can seal an interface between the duct structure inlet and the interior surface. The processing component can include an air inlet and an air exhaust, the processing component being supported on the support shelf, the air inlet receiving an air flow from the duct structure outlet, and the air exhaust being upstream of the chassis outlet opening. In some cases, the processing component of the computer system can be one of a graphics card, a central processing component, and a storage device.

While various spatial and directional terms, such as top, bottom, lower, mid, lateral, horizontal, vertical, front, and the like may be used to describe examples of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

The invention claimed is:

1. An air duct structure to receive a processing component, the air duct structure including:
   an air inlet opening in direct fluid communication with an air inlet of a computer chassis;
   an air outlet opening in direct fluid communication with an air inlet of the processing component;
   a plurality of side walls at least partially defining a channel extending between the air inlet opening and the air outlet opening; and
   a support surface to receive the processing component on the air duct structure relative to the computer chassis,
   wherein the processing component includes an air exhaust to diffuse air, wherein the plurality of side walls at least partially fluidly isolate the air inlet opening from an air diffused from the air exhaust.

2. The air duct structure of claim 1, further comprising a secondary air inlet opening in direct fluid communication with an opening in the chassis, the secondary air inlet opening being positioned opposite the inlet opening in an elongate direction of the air duct structure.

3. The air duct structure of claim 2, further comprising a fan positioned at the secondary air inlet opening.

4. The air duct structure of claim 1, wherein the air duct structure includes a first structure and a second structure, wherein the air inlet opening is defined in the first structure and the air outlet opening is defined in the second structure.

5. The air duct structure of claim 1, wherein the support surface comprises a plurality of rubber feet members, the plurality of rubber feet members being in contact with a surface of the processing component when the processing component is received on the support surface.

6. The air duct structure of claim 1, wherein the air inlet is positioned at a front portion of the computer chassis, and wherein the computer chassis includes exhaust openings in a rear portion of the computer chassis.

7. The air duct structure of claim 1, wherein a flange extends outwardly from the air duct structure along at least a portion of the inlet opening.

8. The air duct structure of claim 1, wherein a retaining lip extends updwardly along at least one side of the support surface, the retaining lip being at a height above a bottom edge of the processing component, to limit a lateral displacement of the processing component relative to the air duct structure.

9. The air duct structure of claim 2, wherein a height of the inlet opening is greater than a height of the support surface.

10. A computer system comprising:
   a computer chassis including a chassis inlet on a first side of the computer chassis, a chassis outlet opening on a second side of the computer chassis, and an interior surface facing an interior of the chassis;
   a duct structure including a support shelf, a plurality of side walls, and a sealing component, the plurality of side walls defining a channel between a duct structure inlet and a duct structure outlet, the duct structure inlet being aligned with the chassis inlet to receive an air flow into the channel, and the sealing component sealing an interface between the duct structure inlet and the interior surface; and
   a processing component including an air inlet and an air exhaust, the processing component being supported on the support shelf, the air inlet receiving an air flow from the duct structure outlet, and the air exhaust being upstream of the chassis outlet opening.

11. The computer system of claim 10, wherein the processing component is one of a graphics card, a central processing component, and a storage device.

\* \* \* \* \*